(12) United States Patent
Takamine

(10) Patent No.: US 9,774,314 B2
(45) Date of Patent: *Sep. 26, 2017

(54) SURFACE ACOUSTIC WAVE FILTER DEVICE AND DUPLEXER

(71) Applicant: Murata Manufacturing Co., Ltd., Nagaokakyo-shi, Kyoto-fu (JP)

(72) Inventor: Yuichi Takamine, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 72 days.

This patent is subject to a terminal disclaimer.

(21) Appl. No.: 14/959,135

(22) Filed: Dec. 4, 2015

(65) Prior Publication Data

US 2016/0094201 A1    Mar. 31, 2016

Related U.S. Application Data

(63) Continuation of application No. PCT/JP2014/055915, filed on Mar. 7, 2014.

(30) Foreign Application Priority Data

Jun. 13, 2013 (JP) ................... 2013-124698

(51) Int. Cl.
    *H03H 9/72*   (2006.01)
    *H03H 9/64*   (2006.01)
    (Continued)

(52) U.S. Cl.
    CPC ............ *H03H 9/725* (2013.01); *H03H 9/008* (2013.01); *H03H 9/0038* (2013.01);
    (Continued)

(58) Field of Classification Search
    CPC .. H03H 9/0038; H03H 9/0052; H03H 9/0057; H03H 9/0066; H03H 9/0071;
    (Continued)

(56) References Cited

U.S. PATENT DOCUMENTS 7,969,259 B2 * 6/2011 Detlefsen ............. H03H 9/0057
                                                              333/193
8,031,034 B1 * 10/2011 Solal .................... H03H 9/0061
                                                              333/193
(Continued)

FOREIGN PATENT DOCUMENTS

DE      198 18 038 A1 * 11/1999
JP      2001-267885 A    9/2001
(Continued)

OTHER PUBLICATIONS

English language machine translation of JP 2006-186433 A, published Jul. 13, 2006, 6 pages.*

(Continued)

*Primary Examiner* — Barbara Summons
(74) *Attorney, Agent, or Firm* — Keating & Bennett, LLP

(57) ABSTRACT

A surface acoustic wave filter device includes surface acoustic wave filters, one of which includes a longitudinally coupled resonator-type first filter section and a longitudinally coupled resonator-type second filter section. The second filter section is electrically connected in parallel or series with the first filter section on at least one of an input signal side and an output signal side. The first filter section includes a first IDT group including three IDTs. The second filter section includes a second IDT group including three IDTs. Another surface acoustic wave filter includes a third IDT group that is cascade connected to the first filter section and the second filter section and includes IDTs arranged in order in a line in a surface acoustic wave propagation direction.

14 Claims, 9 Drawing Sheets

(51) Int. Cl.
*H03H 9/00* (2006.01)
*H03H 9/145* (2006.01)
*H03H 9/54* (2006.01)

(52) U.S. Cl.
CPC ...... *H03H 9/14588* (2013.01); *H03H 9/6433* (2013.01); *H03H 9/6469* (2013.01); *H03H 9/6496* (2013.01); *H03H 9/54* (2013.01)

(58) Field of Classification Search
CPC ...... H03H 9/008; H03H 9/14588; H03H 9/64; H03H 9/6433; H03H 9/6466; H03H 9/6469; H03H 9/6473; H03H 9/6476; H03H 9/6496; H03H 9/725
USPC .............................. 333/133, 195; 310/313 D
See application file for complete search history.

(56) References Cited

U.S. PATENT DOCUMENTS

| | | |
|---|---|---|
| 2001/0022544 A1 | 9/2001 | Endoh et al. |
| 2002/0145361 A1 | 10/2002 | Shibata et al. |
| 2007/0159269 A1 | 7/2007 | Taniguchi |
| 2007/0182511 A1 | 8/2007 | Takamine |
| 2008/0238576 A1 | 10/2008 | Takahashi et al. |
| 2009/0002097 A1 | 1/2009 | Takamine |
| 2009/0116340 A1* | 5/2009 | Tanaka ................. H03H 9/0038 367/137 |
| 2011/0063046 A1 | 3/2011 | Fujiwara et al. |
| 2012/0262246 A1 | 10/2012 | Yasuda |
| 2016/0065175 A1* | 3/2016 | Takamine ................. H03H 9/64 333/100 |

FOREIGN PATENT DOCUMENTS

| | | | |
|---|---|---|---|
| JP | 2003-318700 A | | 11/2003 |
| JP | 2006-186433 A | * | 7/2006 |
| JP | 2007-189390 A | | 7/2007 |
| JP | 2008-252678 A | | 10/2008 |
| JP | 2010-251964 A | | 11/2010 |
| JP | 2011-061570 A | | 3/2011 |
| WO | 2006/049000 A1 | | 5/2006 |
| WO | 2007/116760 A1 | | 10/2007 |

OTHER PUBLICATIONS

Official Communication issued in International Patent Application No. PCT/JP2014/055915, dated Apr. 8, 2014.

* cited by examiner

SURFACE ACOUSTIC WAVE FILTER DEVICE AND DUPLEXER

BACKGROUND OF THE INVENTION

1. Field of the Invention

The present invention relates to surface acoustic wave filter devices and duplexers, and in particular relates to a surface acoustic wave filter device including a plurality of longitudinally coupled resonator-type filters and to a duplexer including such a surface acoustic wave filter device.

2. Description of the Related Art

A surface acoustic wave filter device of the related art is disclosed in International Publication No. 2006/049000 for example. In International Publication No. 2006/049000, a configuration is disclosed in which 5-interdigital transducer (5-IDT) longitudinally coupled resonator-type surface acoustic wave filters are cascade connected to each other in two stages.

There is a problem with the surface acoustic wave filter device in which 5-IDT longitudinally coupled resonator-type surface acoustic wave filters are cascade connected in two stages in that, compared with a configuration in which 3-IDT longitudinally coupled resonator-type surface acoustic wave filters are cascade connected to each other in two stages, a ripple is generated inside the passband and spurious is generated in the vicinity of the passband.

SUMMARY OF THE INVENTION

Preferred embodiments of the present invention provide a surface acoustic wave filter device that is able to effectively reduce a ripple inside a passband and reduce spurious in a vicinity of the passband.

A surface acoustic wave filter device according to a preferred embodiment of the present invention includes a piezoelectric substrate, a first surface acoustic wave filter provided on the piezoelectric substrate and a second surface acoustic wave filter provided on the piezoelectric substrate. The first surface acoustic wave filter includes a longitudinally coupled resonator-type first filter section and a longitudinally coupled resonator-type second filter section. The second filter section is electrically connected in parallel or series with the first filter section on at least one of an input signal side and an output signal side. The first filter section includes a first IDT group and a pair of first reflectors. The first IDT group includes three IDTs arranged in a line in a surface acoustic wave propagation direction. The pair of first reflectors are arranged on either side of the first IDT group in the surface acoustic wave propagation direction. The second filter section includes a second IDT group and a pair of second reflectors. The second IDT group includes three IDTs arranged in a line in a surface acoustic wave propagation direction. The pair of second reflectors are arranged on either side of the second IDT group in the surface acoustic wave propagation direction. The second surface acoustic wave filter includes a third IDT group and a pair of third reflectors. The third IDT group includes a first IDT, a second IDT, a third IDT, a fourth IDT and a fifth IDT arranged in order in a line in the surface acoustic wave propagation direction and is cascade connected with the first filter section and the second filter section. The pair of third reflectors are arranged on either side of the third IDT group in the surface acoustic wave propagation direction.

It is preferable that the surface acoustic wave filter device further include a pair of wiring lines that connect the first surface acoustic wave filter and the second surface acoustic wave filter to each other, and that one signal transmitted by one of the pair of wiring lines and another signal transmitted by the other of the pair of wiring lines have opposite phases to each other.

In the surface acoustic wave filter device, it is preferable that the third IDT include a first divided IDT portion and a second divided IDT portion obtained by dividing the third IDT into two portions in the surface acoustic wave propagation direction, that the first divided IDT portion and the first filter section be cascade connected to each other and that the second divided IDT portion and the second filter section be cascade connected to each other.

In the surface acoustic wave filter device, it is preferable that the third IDT have a comb-tooth electrode that opposes the first divided IDT portion and the second divided IDT portion, and that the comb-tooth electrode has an even number of electrode fingers arranged between the first divided IDT portion and the second divided IDT portion.

A duplexer according to a preferred embodiment of the present invention includes a surface acoustic wave filter device according to any of the above-described aspects of various preferred embodiments of the present invention.

According to various preferred embodiments of the present invention, a surface acoustic wave filter device effectively reduces both a ripple inside the passband and spurious in the vicinity of the passband.

The above and other elements, features, steps, characteristics and advantages of the present invention will become more apparent from the following detailed description of the preferred embodiments with reference to the attached drawings.

Figure 1:
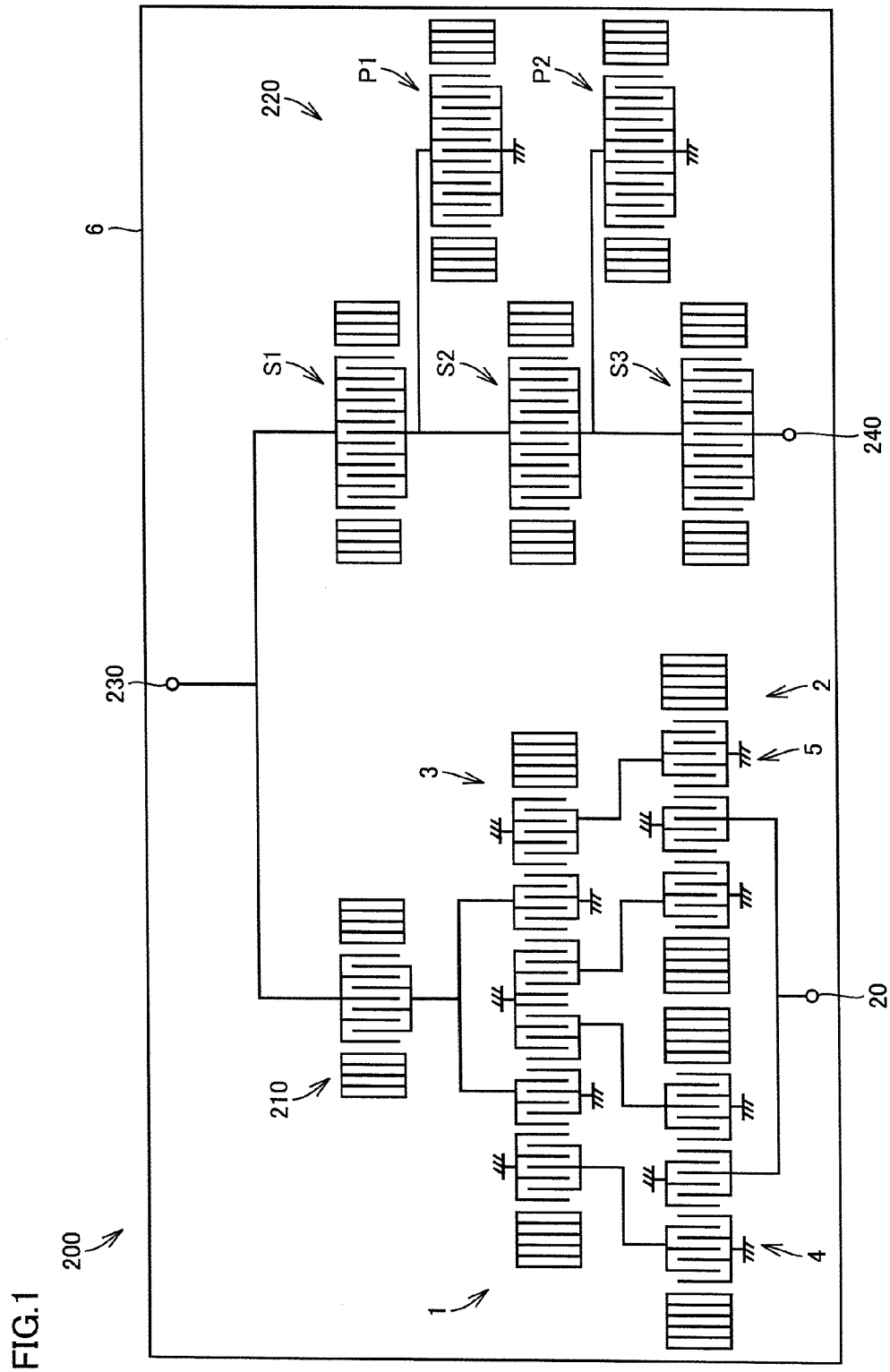
FIG. 1 is a schematic plan view illustrating a duplexer including a surface acoustic wave filter device of a first preferred embodiment of the present invention.

DETAILED DESCRIPTION OF THE
PREFERRED EMBODIMENTS

Hereafter, preferred embodiments of the present invention will be described on the basis of the drawings. In the drawings referred to below, identical or corresponding elements or portions will be denoted by the same reference symbols and repeated description thereof will be omitted.

First Preferred Embodiment

FIG. 1 is a schematic plan view illustrating a duplexer 200 including a surface acoustic wave filter device 1 of a first preferred embodiment of the present invention. The surface acoustic wave filter device 1 of the first preferred embodiment can be suitably used in a duplexer application in which large attenuation is required in the vicinity of a passband, for example.

Referring to FIG. 1, the duplexer 200 includes an antenna terminal 230, which is connected to an antenna. The surface acoustic wave filter device 1 of the first preferred embodiment is connected to the antenna terminal 230 via a surface acoustic wave resonator 210, which is for phase adjustment. A reception-side band pass filter is defined by the surface acoustic wave filter device 1 connected between the antenna terminal 230 and a reception terminal, that is, an output terminal 20.

Furthermore, a surface acoustic wave filter device 220, which defines a transmission-side band pass filter, is connected to the antenna terminal 230. In the first preferred embodiment of the present invention, the surface acoustic wave filter device 220 has a ladder circuit configuration including a series arm connected between the antenna terminal 230 and a transmission terminal 240, a plurality of series arm resonators S1, S2 and S3 provided in the series arm, and a plurality of parallel arm resonators P1 and P2 provided between the series arm and the ground potential. The plurality of series arm resonators S1, S2 and S3 are connected between the transmission terminal 240 and the antenna terminal 230. The series arm resonators S1, S2 and S3 and the parallel arm resonators P1 and P2 are each defined by a 1-port surface acoustic wave resonator.

The duplexer 200 is constructed by forming the depicted electrode structure on a main surface of a piezoelectric substrate 6. The reception-side band pass filter and the transmission-side band pass filter do not necessarily have to be provided on the same piezoelectric substrate and may be instead provided on different piezoelectric substrates.

Figure 2:
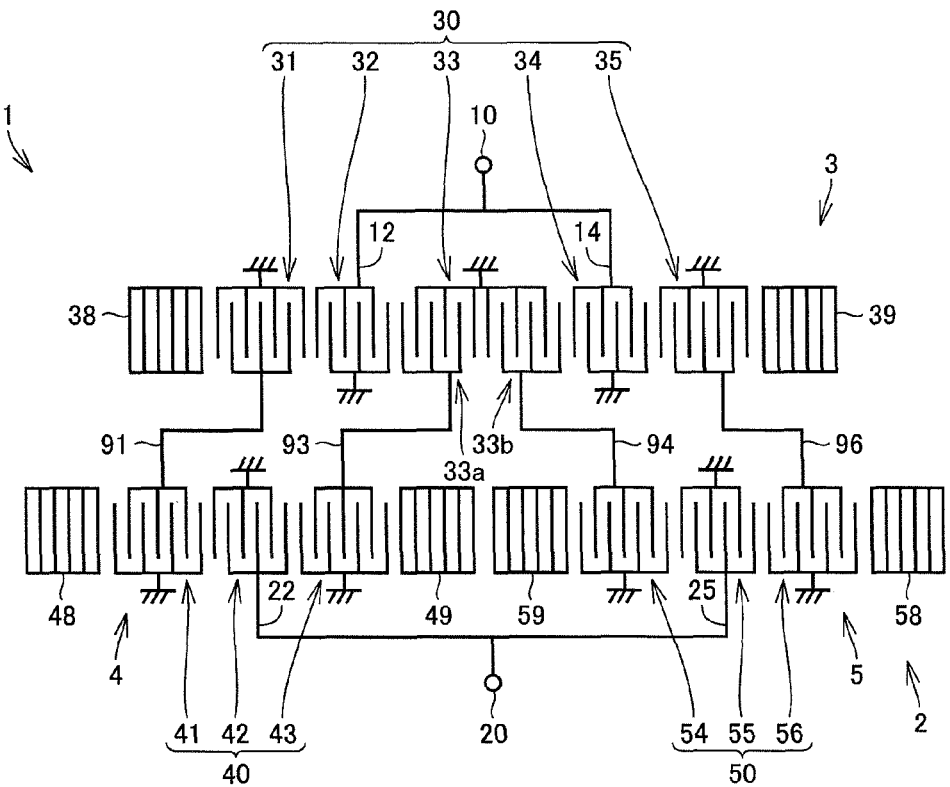
FIG. 2 is a schematic plan view illustrating the basic configuration of the surface acoustic wave filter device of the first preferred embodiment of the present invention.

FIG. 2 is a schematic plan view illustrating the basic configuration of the surface acoustic wave filter device 1 of the first preferred embodiment of the present invention. Referring to FIG. 2, the surface acoustic wave filter device 1 according to the first preferred embodiment includes a surface acoustic wave filter 2 (hereafter, also referred to as a SAW (surface acoustic wave) filter 2), which defines and functions as a first surface acoustic wave filter, and a surface acoustic wave filter 3 (hereafter, also referred to as SAW filter 3), which defines and functions as a second surface acoustic wave filter different to the surface acoustic wave filter 2. The surface acoustic wave filters 2 and 3 are constructed by forming the depicted electrode structures on the main surface of the piezoelectric substrate 6 illustrated in FIG. 1. The surface acoustic wave filters 2 and 3 are cascade connected with each other in two stages.

In the first preferred embodiment, a propagation direction of a surface acoustic wave in the surface acoustic wave filter 2 and a propagation direction of a surface acoustic wave in the surface acoustic wave filter 3 are parallel or substantially parallel to each other (left-right direction in FIG. 2).

The SAW filter 2 includes a longitudinally coupled resonator-type first filter section 4 and a longitudinally coupled resonator-type second filter section 5. The first filter section 4 and the second filter section 5 are connected in parallel with the output terminal 20. The second filter section 5 is arranged next to the first filter section 4 in the surface acoustic wave propagation direction.

The first filter section 4 includes a first interdigital transducer (IDT) group 40. The first IDT group 40 includes a plurality of IDTs, namely three IDTs which are an IDT 41 defining and functioning as a first IDT, an IDT 42 defining and functioning as a second IDT and an IDT 43 defining and functioning as a third IDT. The IDT 41, the IDT 42 and the IDT 43 are arranged in order in a line in the surface acoustic wave propagation direction. A reflector 48 is arranged on one side of the first IDT group 40 in the surface acoustic wave propagation direction. A reflector 49 is arranged on the other side of the first IDT group 40 in the surface acoustic wave propagation direction. The reflectors 48 and 49 define a pair of first reflectors arranged on either side of the first IDT group 40 in the surface acoustic wave propagation direction. The first filter section 4 is a 3-IDT longitudinally coupled resonator-type surface acoustic wave filter.

The second filter section 5 includes a second IDT group 50. The second IDT group 50 includes a plurality of IDTs, namely three IDTs which are an IDT 54 defining and functioning as a first IDT, an IDT 55 defining and functioning as a second IDT and an IDT 56 defining and functioning as a third IDT. The IDT 54, the IDT 55 and the IDT 56 are arranged in order in a line in the surface acoustic wave propagation direction. A reflector 58 is arranged on one side of the second IDT group 50 in the surface acoustic wave propagation direction. A reflector 59 is arranged on the other side of the second IDT group 50 in the surface acoustic wave propagation direction. The reflectors 58 and 59 define a pair of second reflectors arranged on either side of the second IDT group 50 in the surface acoustic wave propagation direction. The second filter section 5 is a 3-IDT longitudinally coupled resonator-type surface acoustic wave filter.

The SAW filter 3 includes a third IDT group 30. The third IDT group 30 includes a plurality of IDTs, namely five IDTs which are an IDT 31 defining and functioning as a first IDT, an IDT 32 defining and functioning as a second IDT, an IDT 33 defining and functioning as a third IDT, an IDT 34 defining and functioning as a fourth IDT and an IDT 35 defining and functioning as a fifth IDT. The IDT 31, the IDT 32, the IDT 33, the IDT 34 and the IDT 35 are arranged in order in a line in the surface acoustic wave propagation direction. A reflector 38 is arranged on one side of the third IDT group 30 in the surface acoustic wave propagation direction. A reflector 39 is arranged on the other side of the third IDT group 30 in the surface acoustic wave propagation direction. The reflectors 38 and 39 define a pair of third reflectors arranged on either side of the third IDT group 30 in the surface acoustic wave propagation direction. The SAW filter 3 is a 5-IDT longitudinally coupled resonator-type surface acoustic wave filter.

The central IDT 33 of the third IDT group 30 is bisected in a central portion thereof in the surface acoustic wave propagation direction. That is, the IDT 33 includes a first divided IDT portion 33a and a second divided IDT portion 33b obtained by dividing the IDT 33 into two portions in the surface acoustic wave propagation direction. The first divided IDT portion 33a and the second divided IDT portion 33b are arranged in order in a line in the surface acoustic wave propagation direction.

The surface acoustic wave filter device 1 also includes an input terminal 10 and the output terminal 20. The IDTs 31, 32, 33, 34 and 35 each include a pair of comb-tooth electrodes arranged so as to face each other such their respective electrode fingers are adjacent to one another in the surface acoustic wave propagation direction. The IDTs 41, 42 and 43 each include a pair of comb-tooth electrodes arranged so as to face each other such their respective electrode fingers lie adjacent to one another in the surface acoustic wave propagation direction. The IDTs 54, 55 and 56 each include a pair of comb-tooth electrodes arranged so as to face each other such their respective electrode fingers lie adjacent to one another in the surface acoustic wave propagation direction.

When the input terminal 10 side of the piezoelectric substrate 6 is referred to as a 1st side and an output terminal side of the piezoelectric substrate 6, which is in the vicinity of the other edge of the piezoelectric substrate 6 facing the one edge of the piezoelectric substrate 6 which the input terminal 10 is arranged near, is referred to as a 2nd side, one of the comb-tooth electrodes of the IDT 31 on the 1st side is connected to a ground potential. The other comb-tooth electrode of the IDT 31 on the second side is connected to one of the comb-tooth electrodes of the IDT 41 on the first side via a signal line 91, which is an interstage connection wiring line. One of the comb-tooth electrodes of the IDT 32 on the first side is connected to the input terminal 10 via a signal line 12. The other comb-tooth electrode of the IDT 32 on the second side is connected to the ground potential.

One of the comb-tooth electrodes of the IDT 33 on the first side extends in one piece in the surface acoustic wave propagation direction without being divided and is connected to the ground potential. The other of the comb-tooth electrodes of the IDT 33 on the second side is divided to define the first divided IDT portion 33a and the second divided IDT portion 33b. Out of the comb-tooth electrode divided in the surface acoustic wave propagation direction, the side close to the IDT 32 defines the first divided IDT portion 33a and the side close to the IDT 34 forms the second divided IDT portion 33b. The first divided IDT portion 33a is connected to one of the comb-tooth electrodes of the IDT 43 on the first side via a signal line 93, which is an interstage connection wiring line. The second divided IDT portion 33b is connected to one of the comb-tooth electrodes of the IDT 54 on the first side via a signal line 94, which is an interstage connection wiring line. The number of electrode fingers arranged between the first divided IDT portion 33a and the second divided IDT portion 33b out of the electrode fingers of the comb-tooth electrode of the IDT 33 on the first side is an even number. In more detail, the number of electrode fingers of one of the comb-tooth electrodes of the IDT 33 on the first side interposed between the other comb-tooth electrode of the first divided IDT portion 33a on the second side and the other comb-tooth electrode of the second divided IDT portion 33b on the second side is an even number.

One of the comb-tooth electrodes of the IDT 34 on the first side is connected to the input terminal 10 via a signal line 14. The other comb-tooth electrode of the IDT 34 on the second side is connected to the ground potential. One of the comb-tooth electrodes of the IDT 35 on the first side is connected to the ground potential. The other comb-tooth electrode of the IDT 35 on the second side is connected to one of the comb-tooth electrodes of the IDT 56 on the first side via a signal line 96, which is an interstage connection wiring line.

One of the comb-tooth electrodes of the IDT 41 on the first side is connected to the other comb-tooth electrode of the IDT 31 on the second side via the signal line 91, which is an interstage connection wiring line. The other comb-tooth electrode of the IDT 41 on the second side is connected to the ground potential. One of the comb-tooth electrodes of the IDT 42 on the first side is connected to the ground potential. The other comb-tooth electrode of the IDT 42 on the second side is connected to the output terminal 20 via a signal line 22. One of the comb-tooth electrodes of the IDT 43 on the first side is connected to the first divided IDT portion 33a via the signal line 93, which is an interstage connection wiring line. The other comb-tooth electrode of the IDT 43 on the second side is connected to the ground potential.

One of the comb-tooth electrodes of the IDT 54 on the first side is connected to the second divided IDT portion 33b via the signal line 94, which is an interstage connection wiring line. The other comb-tooth electrode of the IDT 54 on the second side is connected to the ground potential. One of the comb-tooth electrodes of the IDT 55 on the first side is connected to the ground potential. The other comb-tooth electrode of the IDT 55 on the second side is connected to the output terminal 20 via a signal line 25. One of the comb-tooth electrodes of the IDT 56 on the first side is connected to the other comb-tooth electrode of the IDT 35 on the second side via the signal line 96, which is an interstage connection wiring line. The other comb-tooth electrode of the IDT 56 on the second side is connected to the ground potential.

The IDT 31 and the IDT 41 are cascade connected to each other using the signal line 91, which is an interstage connection wiring line. The first divided IDT portion 33a and the IDT 43 are cascade connected to each other using the signal line 93, which is an interstage connection wiring line. The second divided IDT portion 33b and the IDT 54 are cascade connected to each other using the signal line 94, which is an interstage connection wiring line. The IDT 35 and the IDT 56 are cascade connected to each other using the signal line 96, which is an interstage connection wiring line. The cascade-connected IDTs have the same number of electrode fingers as each other and consequently good filter characteristics are obtained since impedance matching is easily obtained.

A common connection is provided between one end of the IDT 32 and one end of the IDT 34 using the signal lines 12 and 14 and this common connection is then connected to the input terminal 10. Signals transmitted to the IDTs 32 and 34 from the input terminal 10 have the same phase as each other. The input terminal 10 is an unbalanced signal input terminal though which an unbalanced signal is input.

The IDTs 31 and 35 are symmetrical with each other with a line perpendicular or substantially perpendicular to the surface acoustic wave propagation direction and extending through the center of the SAW filter 3 (that is, a line extending in the vertical direction in FIG. 2 and passing between the first divided IDT portion 33a and the second divided IDT portion 33b) acting as an axis of symmetry. The first divided IDT portion 33a and the second divided IDT portion 33b are also symmetrical with each other about the axis of symmetry. On the other hand, the IDTs 32 and 34 are non-symmetrical with each other about the axis of symmetry. Specifically, if the IDT 32 were symmetrically shifted about the axis of symmetry and flipped vertically in the direction in which the axis of symmetry extends, the IDT 32 would match the IDT 34.

The IDT 41 included in the first filter section 4 and the IDT 56 included in the second filter section 5 are symmetrical with each other with a line perpendicular or substantially perpendicular to the surface acoustic wave propagation direction and passing through the center of the SAW filter 2 (that is, a line extending vertically in FIG. 1 and passing between the reflectors 49 and 59) acting as an axis of symmetry. The IDT 43 and the IDT 54 are also are symmetrical with each other about the axis of symmetry. On the other hand, the IDT 42 and the IDT 55 are non-symmetrical with each other about the axis of symmetry. Specifically, if the IDT 42 were symmetrically shifted about the axis of symmetry and flipped vertically in the direction in which the axis of symmetry extends, the IDT 42 would match the IDT 55.

The first filter section 4, which is included in the surface acoustic wave filter 2, and the surface acoustic wave filter 3 are connected to each other by the signal lines 91 and 93 defining and functioning as a pair of wiring lines. A signal transmitted by the signal line 91 and a signal transmitted by the signal line 93 have opposite phases to each other. The second filter section 5, which is included in the surface acoustic wave filter 2, and the surface acoustic wave filter 3 are connected to each other by the signal lines 94 and 96 defining and functioning as a pair of wiring lines. A signal transmitted by the signal line 94 and a signal transmitted by the signal line 96 have opposite phases to each other. The orientations of the IDTs are adjusted such that signals transmitted by the signal lines 93 and 96 have opposite phases to the signals transmitted by the signal lines 91 and 94.

Accordingly, the phase of a signal transmitted to the SAW filter 2 via the signal lines 91 and 94 and the phase of a signal transmitted to the SAW filter 2 via the signal lines 93 and 96 differ by approximately 180° at the passband frequency of the surface acoustic wave filter device 1. The signal lines 91 and 94 and the signal lines 93 and 96 define and function as balanced signal input terminals through which balanced signals are input to the SAW filter 2. A common connection is provided between one end of the IDT 42 and one end of the IDT 55 using the signal lines 22 and 25 and this common connection is then connected to the output terminal 20. The output terminal 20 is an unbalanced signal output terminal through which an unbalanced signal is output from the SAW filter 2. The surface acoustic wave filter 2 preferably is a balanced signal input-unbalanced signal output filter.

The first IDT group 40 included in the first filter section 4 and the second IDT group 50 included in the second filter section 5 are electrically connected in parallel with each other. The SAW filter 2 has a configuration in which two filter sections, namely the first filter section 4 and the second filter section 5, are connected in parallel with each other.

Figure 3:
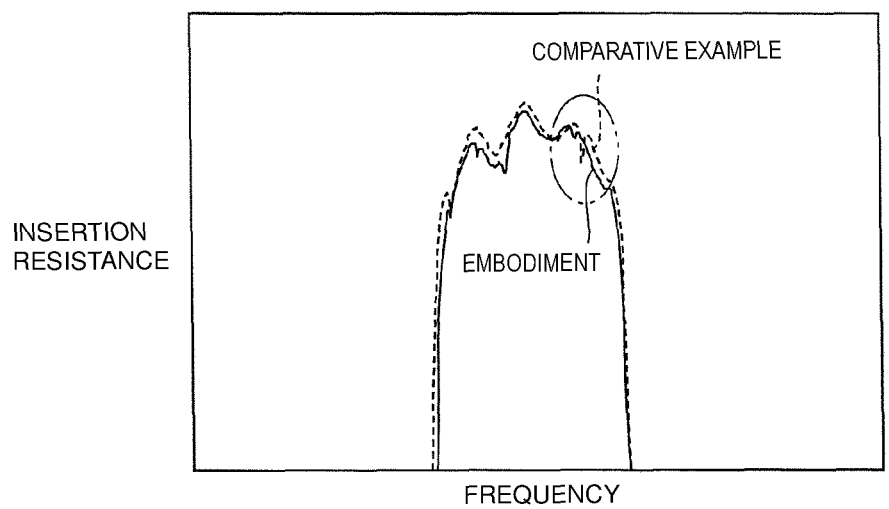
FIG. 3 is a first diagram illustrating transmission characteristics of the surface acoustic wave filter device of the first preferred embodiment of the present invention.

FIG. 3 is a first diagram illustrating transmission characteristics of the surface acoustic wave filter device 1 of the first preferred embodiment. In FIG. 3, the horizontal axis represents frequency and the vertical axis represents insertion loss. In FIG. 3, the transmission characteristics of the surface acoustic wave filter device 1 of this preferred embodiment with respect to frequency are indicated by a solid line. As a comparative example, the transmission characteristics with respect to frequency of a surface acoustic wave filter device having a configuration obtained by changing the second stage of the surface acoustic wave filter device 1 of the first preferred embodiment into a 5-IDT longitudinally coupled resonator-type surface acoustic wave filter and cascade connecting the 5-IDT longitudinally coupled resonator-type surface acoustic wave filters with each other in two stages are indicated by a broken line as well in FIG. 3.

Paying particular attention to the region surrounded by a two-dot broken line in FIG. 3, a ripple is generated inside the passband in the comparative example in which 5-IDT longitudinally coupled resonator-type surface acoustic wave filters are cascade connected to each other in two stages. On the other hand, in the surface acoustic wave filter device 1 of the first preferred embodiment in which the first stage is a 5-IDT longitudinally coupled resonator-type surface acoustic wave filter and the second stage includes two parallel-connected 3-IDT longitudinally coupled resonator-type surface acoustic wave filters, there is substantially no ripple generated inside the passband. Therefore, in the surface acoustic wave filter device 1 having the configuration of the first preferred embodiment, it is clear that a ripple inside the passband is effectively reduced.

Figure 4:
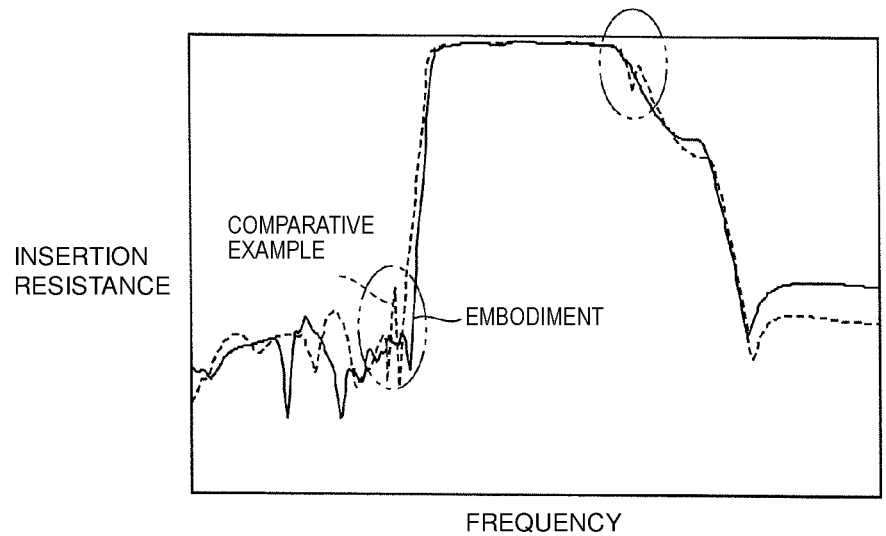
FIG. 4 is a second diagram illustrating transmission characteristics of the surface acoustic wave filter device of the first preferred embodiment of the present invention.

FIG. 4 is a second diagram illustrating transmission characteristics of the surface acoustic wave filter device 1 of the first preferred embodiment. In FIG. 4, the horizontal axis represents frequency and the vertical axis represents insertion loss. In FIG. 4, similarly to as in FIG. 3, the transmission characteristics of the surface acoustic wave filter device 1 of this preferred embodiment with respect to frequency are indicated by a solid line and the transmission characteristics of the surface acoustic wave filter device of the comparative example with respect to frequency are indicated by a broken line.

Paying particular attention to the region surrounded by a two-dot broken line in FIG. 4, spurious is generated in the vicinity of the passband in the comparative example in which 5-IDT longitudinally coupled resonator-type surface acoustic wave filters are cascade connected to each other in two stages. On the other hand, in the surface acoustic wave filter device 1 of the first preferred embodiment in which the first stage preferably is a 5-IDT longitudinally coupled resonator-type surface acoustic wave filter and the second stage includes two parallel-connected 3-IDT longitudinally coupled resonator-type surface acoustic wave filters, spurious is small. Therefore, it is clear that an effect of reducing spurious in the vicinity of the passband is obtained with the surface acoustic wave filter device 1 having the configuration of the first preferred embodiment.

Figure 5:
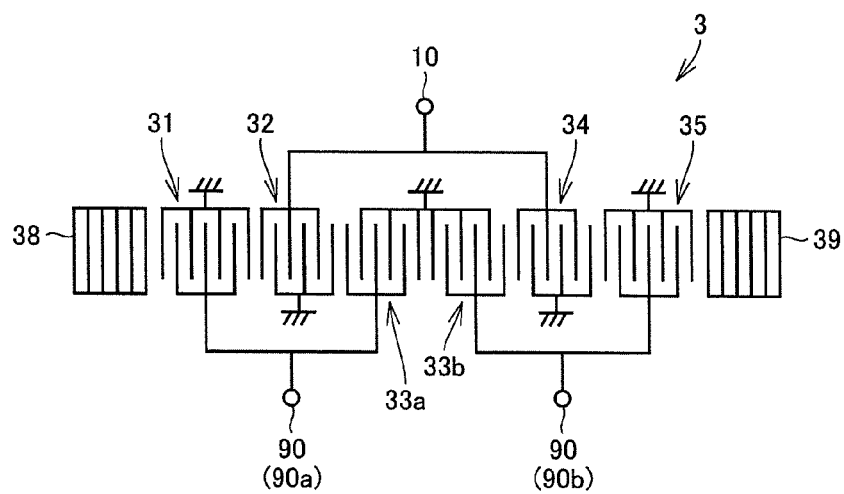
FIG. 5 is a first diagram illustrating the principle behind generation of a ripple and spurious in a 5-IDT longitudinally coupled resonator-type surface acoustic wave filter.
Figure 6:
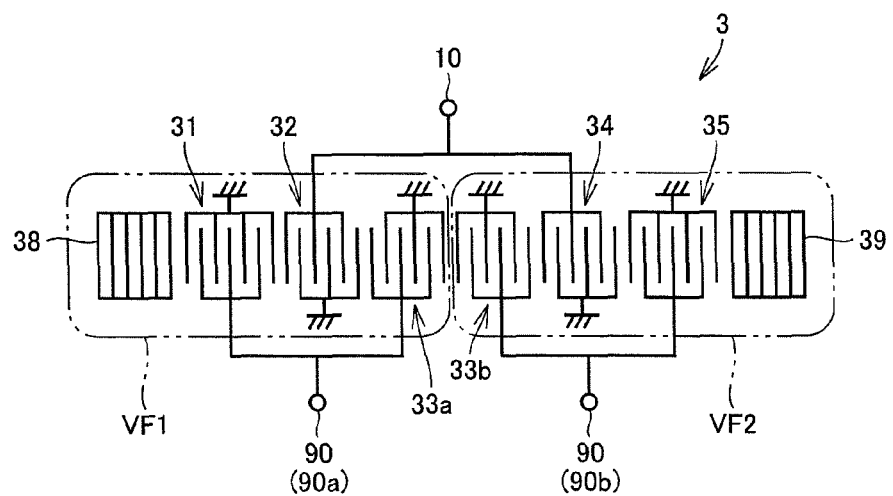
FIG. 6 is a second diagram illustrating the principle behind generation of a ripple and spurious in a 5-IDT longitudinally coupled resonator-type surface acoustic wave filter.

FIG. 5 is a first diagram illustrating the principle behind generation of a ripple and spurious in a 5-IDT longitudinally coupled resonator-type surface acoustic wave filter. FIG. 6 is a second diagram illustrating the principle behind generation of a ripple and spurious in a 5-IDT longitudinally coupled resonator-type surface acoustic wave filter. The principle behind generation of a ripple and spurious in a surface acoustic wave filter device in which 5-IDT longitudinally coupled resonator-type surface acoustic wave filters are connected to each other in two stages will be described with reference to FIGS. 5 and 6.

The surface acoustic wave filter illustrated in FIG. 5 is obtained by virtually extracting the surface acoustic wave filter 3 of the first stage from the surface acoustic wave filter device illustrated in FIG. 2 and is a 5-IDT longitudinally coupled resonator-type surface acoustic wave filter having the same configuration as the surface acoustic wave filter 3.

A common connection is virtually provided between one end of the IDT 31 and one end of the first divided IDT portion 33a using signal lines and this common connection is then connected to an output terminal 90 (90a). A common connection is virtually provided between one end of the second divided IDT portion 33b and one end of the IDT 35 using signal lines and this common connection is then connected to an output terminal 90 (90b).

The 5-IDT longitudinally coupled resonator-type surface acoustic wave filter illustrated in FIG. 5 can be thought of as being substantially equivalent to a configuration in which two 3-IDT longitudinally coupled resonator-type surface acoustic wave filters are connected in parallel with each other. In FIG. 6, two 3-IDT longitudinally coupled resonator-type surface acoustic wave filters obtained by virtually bisecting the 5-IDT longitudinally coupled resonator-type surface acoustic wave filter illustrated in FIG. 5 in the surface acoustic wave propagation direction are illustrated as virtual filters VF1 and VF2 surrounded by two-dot broken lines. One of the filters obtained by bisecting the 5-IDT longitudinally coupled resonator-type surface acoustic wave filter can be thought of as the virtual filter VF1, which is a 3-IDT longitudinally coupled resonator-type surface acoustic wave filter, and the other filter can be thought of as the virtual filter VF2, which is a 3-IDT longitudinally coupled resonator-type surface acoustic wave filter.

The virtual filter VF1 includes an IDT group, which includes the IDT 31, the IDT 32 and the first divided IDT portion 33a arranged in order in a line in the surface acoustic wave propagation direction, and the reflector 38. The virtual filter VF1 has a structure in which the reflector 38 is arranged on one side of the IDT group in the surface acoustic wave propagation direction and no reflector is arranged on the other side. Consequently, the virtual filter VF1 is provided so as to be non-symmetrical in the left-right direction.

The virtual filter VF2 includes an IDT group, which is made up of the second divided IDT portion 33b, the IDT 34 and the IDT 35 arranged in order in a line in the surface acoustic wave propagation direction, and the reflector 39. The virtual filter VF2 has a structure in which the reflector 39 is arranged on one side of the IDT group in the surface acoustic wave propagation direction and no reflector is arranged on the other side. Consequently, the virtual filter VF2 is non-symmetrical in the left-right direction.

It is considered that the occurrence of shifting of the resonant mode in the virtual filters VF1 and VF2 due to the effect of the virtual filters VF1 and VF2 being non-symmetrical in the left-right direction is the cause of the generation of a ripple and spurious in the 5-IDT longitudinally coupled resonator-type surface acoustic wave filter. In addition, it is considered that when 5-IDT longitudinally coupled resonator-type surface acoustic wave filters are cascade connected in two stages, shifting of the resonant mode occurs in the first stage and the second stage due to the effect of parasitic capacitances, and therefore the ripple and spurious become even larger.

Accordingly, the surface acoustic wave filter device 1 of the first preferred embodiment has a configuration in which the SAW filter 3 of the first stage and the SAW filter 2 of the second stage are cascade connected with each other in two stages, the SAW filter 3 of the first stage being a 5-IDT longitudinally coupled resonator-type surface acoustic wave filter, and the SAW filter 2 of the second stage including the first filter section 4 and the second filter section 5, which are 3-IDT longitudinally coupled resonator-type surface acoustic wave filters, connected in parallel with each other. Compared with the configuration in which 5-IDT longitudinally coupled resonator-type surface acoustic wave filters are cascade connected in two stages, a ripple and spurious due to shifting of the resonant mode are only generated in the SAW filter 3 of the first stage in this configuration. In addition, by connecting two 3-IDT longitudinally coupled resonator-type surface acoustic wave filters in parallel with each other, the cross width becomes the same or substantially the same as that in a 5-IDT longitudinally coupled resonator-type surface acoustic wave filter and large degradation of insertion loss does not occur. Therefore, it is possible to effectively reduce a ripple and spurious without large degradation of insertion loss.

Second Preferred Embodiment

Figure 7:
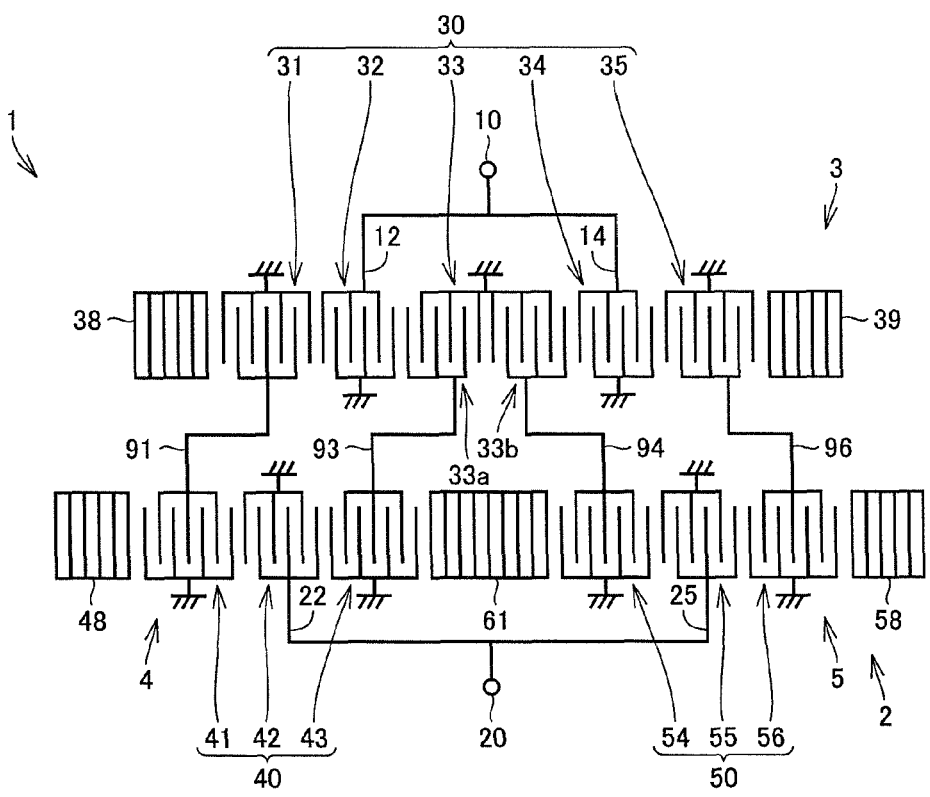
FIG. 7 is a schematic plan view illustrating the basic configuration of a surface acoustic wave filter device of a second preferred embodiment of the present invention.

FIG. 7 is a schematic plan view illustrating the basic configuration of a surface acoustic wave filter device 1 of a second preferred embodiment of the present invention. In the surface acoustic wave filter device 1 of the second preferred embodiment, the reflectors arranged between the first IDT group 40 and the second IDT group 50 are an integrated common reflector 61. The SAW filter 2 has a configuration in which the reflector arranged on the side close to the second filter section 5 out of the pair of reflectors included in the first filter section 4 and the reflector arranged on the side close to the first filter section 4 out of the pair of reflectors included in the second filter section 5 are a shared reflector (common reflector). That is, the surface acoustic wave filter device 1 of the second preferred embodiment has a configuration in which the reflectors 49 and 59 of the first preferred embodiment illustrated in FIG. 2 are replaced with the single common reflector 61. The number of electrode fingers of the common reflector 61 is an odd number of 9 or more. In this preferred embodiment, the number of electrode fingers of the common reflector 61 is 25.

A pair of first reflectors included in the first filter section 4 includes the common reflector 61 and the reflector 48. A pair of second reflectors included in the second filter section 5 includes the common reflector 61 and the reflector 58. The reflector 48 is arranged on the side of the first IDT group 40 distant from the second filter section 5 and is provided as a non-common reflector that is not integrated with a second reflector. The reflector 58 is arranged on the side of the second IDT group 50 distant from the first filter section 4 and is provided as a non-common reflector that is not integrated with a first reflector.

In the thus-configured surface acoustic wave filter device 1 of the second preferred embodiment as well, the SAW filter 3 of the first stage and the SAW filter 2 of the second stage are cascade connected with each other in two stages, the SAW filter 3 of the first stage being a 5-IDT longitudinally coupled resonator-type surface acoustic wave filter, and the SAW filter 2 of the second stage including the first filter section 4 and the second filter section 5, which are 3-IDT longitudinally coupled resonator-type surface acoustic wave filters, connected in parallel with each other. Thus, a ripple inside the passband is reduced and spurious in the vicinity of the passband is reduced.

Third Preferred Embodiment

Figure 8:
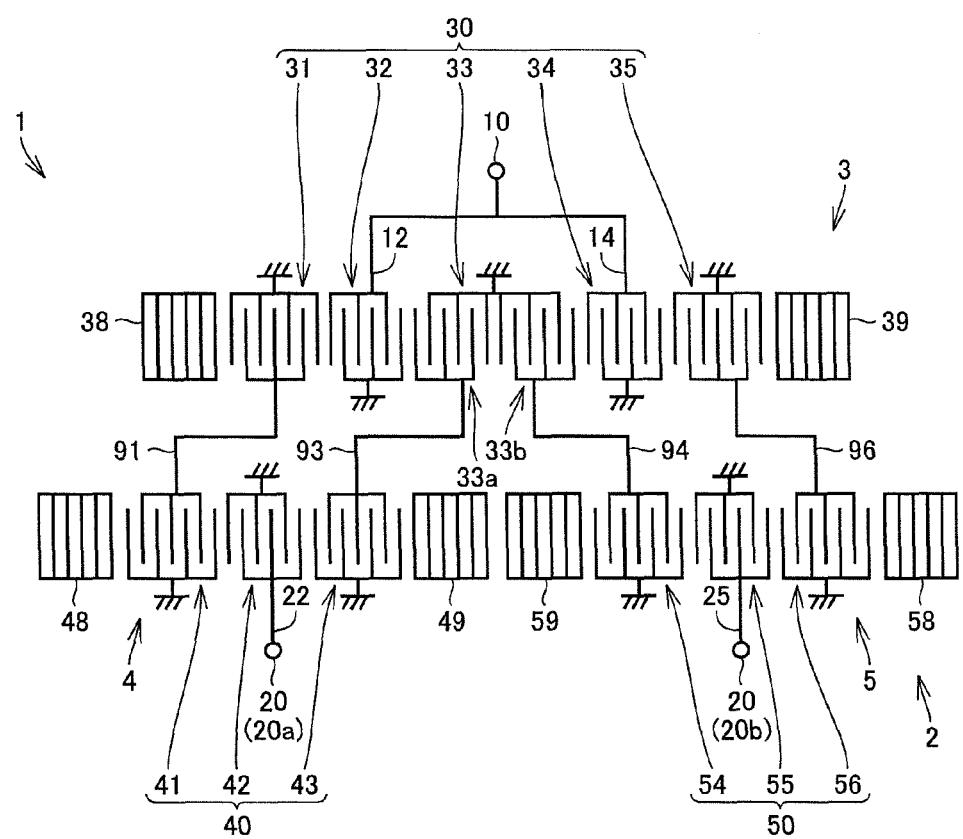
FIG. 8 is a schematic plan view illustrating the basic configuration of a surface acoustic wave filter device of a third preferred embodiment of the present invention.

FIG. 8 is a schematic plan view illustrating the basic configuration of a surface acoustic wave filter device 1 of a third preferred embodiment of the present invention. The surface acoustic wave filter device 1 of the third preferred embodiment includes a pair of output terminals 20a and 20b. The other comb-tooth electrode of the IDT 42 is connected to the output terminal 20a via the signal line 22. The other comb-tooth electrode of the IDT 55 is connected to the output terminal 20b via the signal line 25. The first IDT group 40 included in the first filter section 4 and the second IDT group 50 included in the second filter section 5 are electrically connected in series with each other via the ground potential between the output terminal 20a and the output terminal 20b.

The phase of a signal transmitted from the IDT 42 to the output terminal 20a and the phase of a signal transmitted from the IDT 55 to the output terminal 20b differ by approximately 180° at the passband frequency of the surface acoustic wave filter device 1. The pair of output terminals 20a and 20b are balanced signal output terminals that output balanced signals from the surface acoustic wave filter device 1. Therefore, in the surface acoustic wave filter device 1, a balanced output is able to be extracted from the output terminals 20a and 20b. The surface acoustic wave filter 2 preferably is a balanced signal input-balanced signal output filter. The first IDT group 40 is connected to one of the pair of balanced signal terminals, namely, the output terminal 20a. The second IDT group 50 is connected to the other of the pair of balanced signal terminals, namely, the output terminal 20b.

In the thus-configured surface acoustic wave filter device 1 of the third preferred embodiment as well, the SAW filter 3 of the first stage and the SAW filter 2 of the second stage are cascade connected with each other in two stages, the SAW filter 3 of the first stage being a 5-IDT longitudinally coupled resonator-type surface acoustic wave filter and the SAW filter 2 of the second stage including the first filter section 4 and the second filter section 5, which are 3-IDT longitudinally coupled resonator-type surface acoustic wave filters, connected in series with each other. Thus, a ripple inside the passband is reduced and spurious in the vicinity of the passband is reduced.

Fourth Preferred Embodiment

Figure 9:
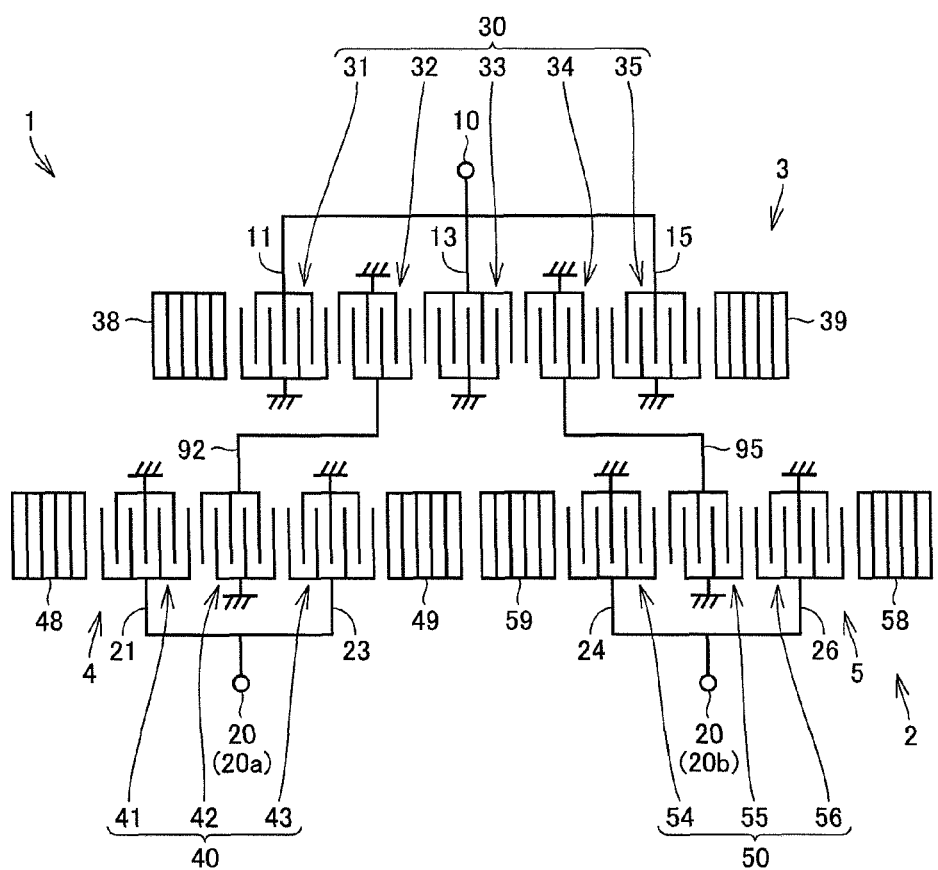
FIG. 9 is a schematic plan view illustrating the basic configuration of a surface acoustic wave filter device of a fourth preferred embodiment of the present invention.

FIG. 9 is a schematic plan view illustrating the basic configuration of a surface acoustic wave filter device 1 of a fourth preferred embodiment of the present invention. In the surface acoustic wave filter device 1 of the fourth preferred embodiment illustrated in FIG. 9, one of the comb-tooth electrodes of the IDT 31 on the first side is connected to the input terminal 10 via a signal line 11. The other comb-tooth electrode of the IDT 31 on the second side is connected to the ground potential. One of the comb-tooth electrodes of the IDT 32 on the first side is connected to the ground potential. The other comb-tooth electrode of the IDT 32 on the second side is connected to one of the comb-tooth electrodes of the IDT 42 on the first side via a signal line 92, which is an interstage connection wiring line.

One of the comb-tooth electrodes of the IDT 33 on the first side is connected to the input terminal 10 via a signal line 13. The other comb-tooth electrode of the IDT 33 on the second side is not divided in the surface acoustic wave propagation direction and is connected to the ground potential. One of the comb-tooth electrodes of the IDT 34 on the first side is connected to the ground potential. The other comb-tooth electrode of the IDT 34 on the second side is connected to one of the comb-tooth electrodes of the IDT 55 on the first side via a signal line 95, which is an interstage connection wiring line. One of the comb-tooth electrodes of the IDT 35 on the first side is connected to the input terminal 10 via a signal line 15. The other comb-tooth electrode of the IDT 35 on the second side is connected to the ground potential.

One of the comb-tooth electrodes of the IDT 41 on the first side is connected to the ground potential. The other comb-tooth electrode of the IDT 41 on the second side is connected to an output terminal 20 via a signal line 21. One of the comb-tooth electrodes of the IDT 42 on the first side is connected to the other comb-tooth electrode of the IDT 32 on the second side via the signal line 92, which is an interstage connection wiring line. The other comb-tooth electrode of the IDT 42 on the second side is connected to the ground potential. One of the comb-tooth electrodes of the IDT 43 on the first side is connected to the ground potential. The other comb-tooth electrode of the IDT 43 on the second side is connected to the output terminal 20a via a signal line 23.

One of the comb-tooth electrodes of the IDT 54 on the first side is connected to the ground potential. The other comb-tooth electrode of the IDT 54 on the second side is connected to the output terminal 20b via a signal line 24. One of the comb-tooth electrodes of the IDT 55 on the first side is connected to the other comb-tooth electrode of the IDT 34 on the second side via the signal line 95, which is an interstage connection wiring line. The other comb-tooth electrode of the IDT 55 on the second side is connected to the ground potential. One of the comb-tooth electrodes of the IDT 56 on the first side is connected to the ground potential. The other comb-tooth electrode of the IDT 56 on the second side is connected to the output terminal 20b via a signal line 26.

A common connection is provided between one end of the IDT 31, one end of the IDT 33 and one end of the IDT 35 using the signal lines 11, 13 and 15 and this common connection is then connected to the input terminal 10. Signals transmitted to the IDTs 31, 33 and 35 from the input terminal 10 have the same phase as each other. The IDT 32 and the IDT 42 are cascade connected to each other using the signal line 92, which is an interstage connection wiring line. The IDT 34 and the IDT 55 are cascade connected to each other using the signal line 95, which is an interstage connection wiring line. A common connection is provided between one end of the IDT 41 and one end of the IDT 43 using the signal lines 21 and 23 and this common connection is then connected to the output terminal 20a. A common connection is provided between one end of the IDT 54 and one end of the IDT 56 using the signal lines 24 and 26 and this common connection is then connected to the output terminal 20b. The first IDT group 40 included in the first filter section 4 and the second IDT group 50 included in the second filter section 5 are electrically connected in series with each other via the ground potential between the output terminals 20a and 20b.

A signal transmitted by the signal line 92 and a signal transmitted by the signal line 95 have opposite phases to each other. The signal line 92 and the signal line 95 define and function as balanced signal input terminals through which balanced signals are input to the SAW filter 2. The pair of output terminals 20a and 20b are balanced signal output terminals through which balanced signals are output from the SAW filter 2. The surface acoustic wave filter 2 preferably is a balanced signal input-balanced signal output filter.

In the thus-configured surface acoustic wave filter device 1 of the fourth preferred embodiment as well, the SAW filter 3 of the first stage and the SAW filter 2 of the second stage are cascade connected with each other in two stages, the SAW filter 3 of the first stage being a 5-IDT longitudinally coupled resonator-type surface acoustic wave filter and the SAW filter 2 of the second stage including the first filter section 4 and the second filter section 5, which are 3-IDT longitudinally coupled resonator-type surface acoustic wave filters, connected in series with each other. Thus, a ripple inside the passband is reduced and spurious in the vicinity of the passband is reduced.

Fifth Preferred Embodiment

Figure 10:
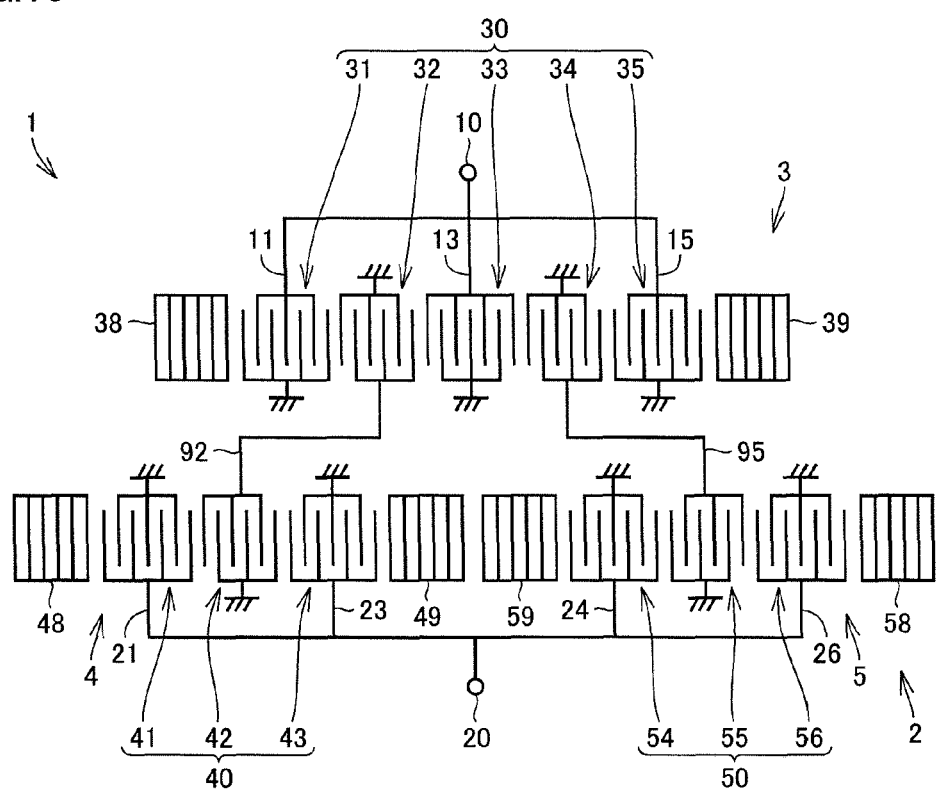
FIG. 10 is a schematic plan view illustrating the basic configuration of a surface acoustic wave filter device of a fifth preferred embodiment of the present invention.

FIG. 10 is a schematic plan view illustrating the basic configuration of a surface acoustic wave filter device 1 of a fifth preferred embodiment of the present invention. The surface acoustic wave filter device 1 of the fifth preferred embodiment has substantially the same configuration as the surface acoustic wave filter device 1 of the fourth preferred embodiment described above and only the configuration of the output terminal 20 is different.

Specifically, in the surface acoustic wave filter device 1 of the fifth preferred embodiment, a common connection is provided between one end of the IDT 41, one end of the IDT 43, one end of the IDT 54 and one end of the IDT 56 using the signal lines 21, 23, 24 and 26 and this common connection is then connected to a single output terminal 20. That is, the first IDT group 40 included in the first filter section 4 and the second IDT group 50 included in the second filter section 5 are electrically in parallel with the output terminal 20, which is an unbalanced signal terminal. The output terminal 20 is an unbalanced signal output terminal through which an unbalanced signal is output from the SAW filter 2. The surface acoustic wave filter 2 preferably is a balanced signal input-unbalanced signal output filter.

In the thus-configured surface acoustic wave filter device 1 of the fifth preferred embodiment as well, the SAW filter 3 of the first stage and the SAW filter 2 of the second stage are cascade connected with each other in two stages, the SAW filter 3 of the first stage being a 5-IDT longitudinally coupled resonator-type surface acoustic wave filter and the SAW filter 2 of the second stage including the first filter section 4 and the second filter section 5, which are 3-IDT longitudinally coupled resonator-type surface acoustic wave filters, connected in parallel with each other. Thus, a ripple inside the passband is reduced and spurious in the vicinity of the passband is reduced.

Sixth Preferred Embodiment

Figure 11:
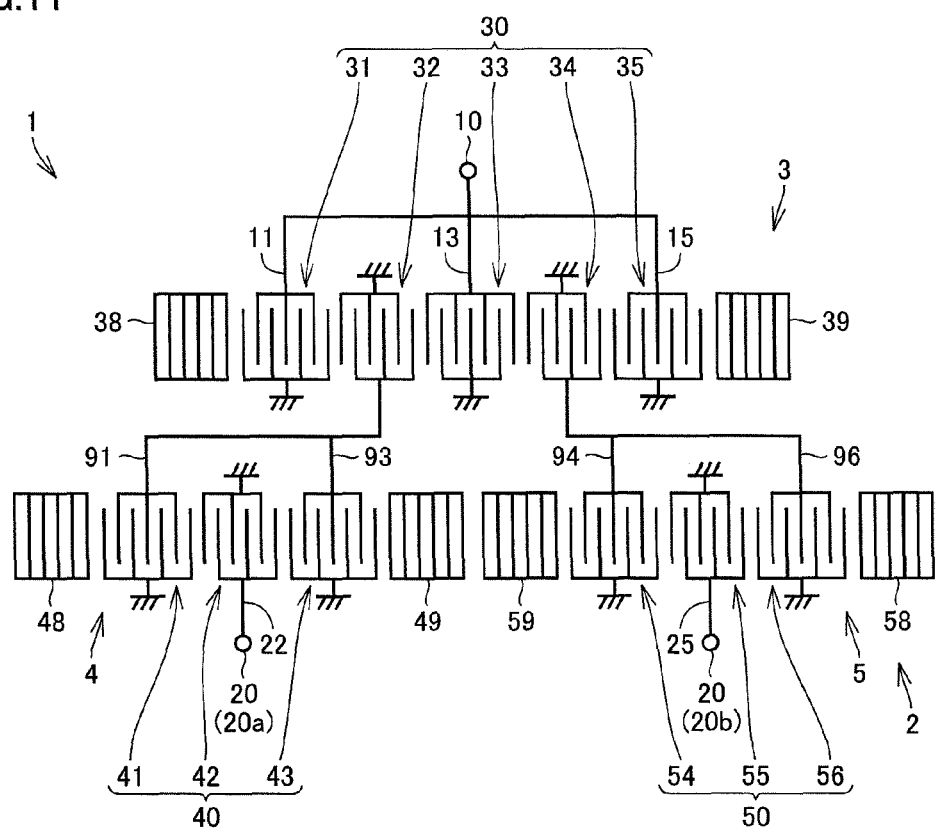
FIG. 11 is a schematic plan view illustrating the basic configuration of a surface acoustic wave filter device of a sixth preferred embodiment of the present invention.

FIG. 11 is a schematic plan view illustrating the basic configuration of a surface acoustic wave filter device 1 of a sixth preferred embodiment of the present invention. In the surface acoustic wave filter device 1 of the sixth preferred embodiment illustrated in FIG. 11, one of the comb-tooth electrodes of the IDT 31 on the first side is connected to the input terminal 10 via the signal line 11. The other comb-tooth electrode of the IDT 31 on the second side is connected to the ground potential. One of the comb-tooth electrodes of the IDT 32 on the first side is connected to the ground potential. The other comb-tooth electrode of the IDT 32 on the second side is connected to one of the comb-tooth electrodes of the IDT 41 on the first side via the signal line 91, which is an interstage connection wiring line, and is connected to one of the comb-tooth electrodes of the IDT 43 on the first side via the signal line 93, which is an interstage connection wiring line.

One of the comb-tooth electrodes of the IDT 33 on the first side is connected to the input terminal 10 via the signal line 13. The other comb-tooth electrode of the IDT 33 on the second side is not divided in the surface acoustic wave propagation direction and is connected to the ground potential. One of the comb-tooth electrodes of the IDT 34 on the first side is connected to the ground potential. The other comb-tooth electrode of the IDT 34 on the second side is connected to one of the comb-tooth electrodes of the IDT 54 on the first side via the signal line 94, which is an interstage connection wiring line, and is connected to one of the comb-tooth electrodes of the IDT 56 on the first side via the signal line 96, which is an interstage connection wiring line. One of the comb-tooth electrodes of the IDT 35 on the first side is connected to the input terminal 10 via the signal line 15. The other comb-tooth electrode of the IDT 35 on the second side is connected to the ground potential.

One of the comb-tooth electrodes of the IDT 41 on the first side is connected to the other comb-tooth electrode of the IDT 32 on the second side via the signal line 91, which is an interstage connection wiring line. The other comb-tooth electrode of the IDT 41 on the second side is connected to the ground potential. One of the comb-tooth electrodes of the IDT 42 on the first side is connected to the ground potential. The other comb-tooth electrode of the IDT 42 on the second side is connected to the output terminal 20a via the signal line 22. One of the comb-tooth electrodes of the IDT 43 on the first side is connected to the other comb-tooth electrode of the IDT 32 on the second side via the signal line 93, which is an interstage connection wiring line. The other comb-tooth electrode of the IDT 43 on the second side is connected to the ground potential.

One of the comb-tooth electrodes of the IDT 54 on the first side is connected to the other comb-tooth electrode of the IDT 34 on the second side via the signal line 94, which is an interstage connection wiring line. The other comb-tooth electrode of the IDT 54 on the second side is connected to the ground potential. One of the comb-tooth electrodes of the IDT 55 on the first side is connected to the ground potential. The other comb-tooth electrode of the IDT 55 on the second side is connected to the output terminal 20b via the signal line 25. One of the comb-tooth electrodes of the IDT 56 on the first side is connected to the other comb-tooth electrode of the IDT 34 on the second side via the signal line 96, which is an interstage connection wiring line. The other comb-tooth electrode of the IDT 56 on the second side is connected to the ground potential.

A common connection is provided between one end of the IDT 31, one end of the IDT 33 and one end of the IDT 35 using the signal lines 11, 13 and 15 and this common connection is then connected to the input terminal 10. Signals transmitted to the IDTs 31, 33 and 35 from the input terminal 10 have the same phase as each other. The IDT 32 and the IDTs 41 and 43 are cascade connected to each other using the signal lines 91 and 93, which are interstage connection wiring lines. The IDT 34 and the IDTs 54 and 56 are cascade connected to each other using the signal lines 94 and 96, which are interstage connection wiring lines. One end of the IDT 42 is connected to the output terminal 20a. One end of the IDT 55 is connected to the output terminal 20b. The pair of output terminals 20a and 20b are balanced signal output terminals through which balanced signals are output from the SAW filter 2. The first IDT group 40 included in the first filter section 4 and the second IDT group 50 included in the second filter section 5 are electrically connected in series with each other via the ground potential between the pair of output terminals 20a and 20b, which are balanced signal terminals.

In the thus-configured surface acoustic wave filter device 1 of the sixth preferred embodiment as well, the SAW filter 3 of the first stage and the SAW filter 2 of the second stage are cascade connected with each other in two stages, the SAW filter 3 of the first stage being a 5-IDT longitudinally coupled resonator-type surface acoustic wave filter and the SAW filter 2 of the second stage including the first filter section 4 and the second filter section 5, which are 3-IDT longitudinally coupled resonator-type surface acoustic wave filters, connected in series with each other. Thus, a ripple inside the passband is reduced and spurious in the vicinity of the passband is reduced.

Seventh Preferred Embodiment

Figure 12:
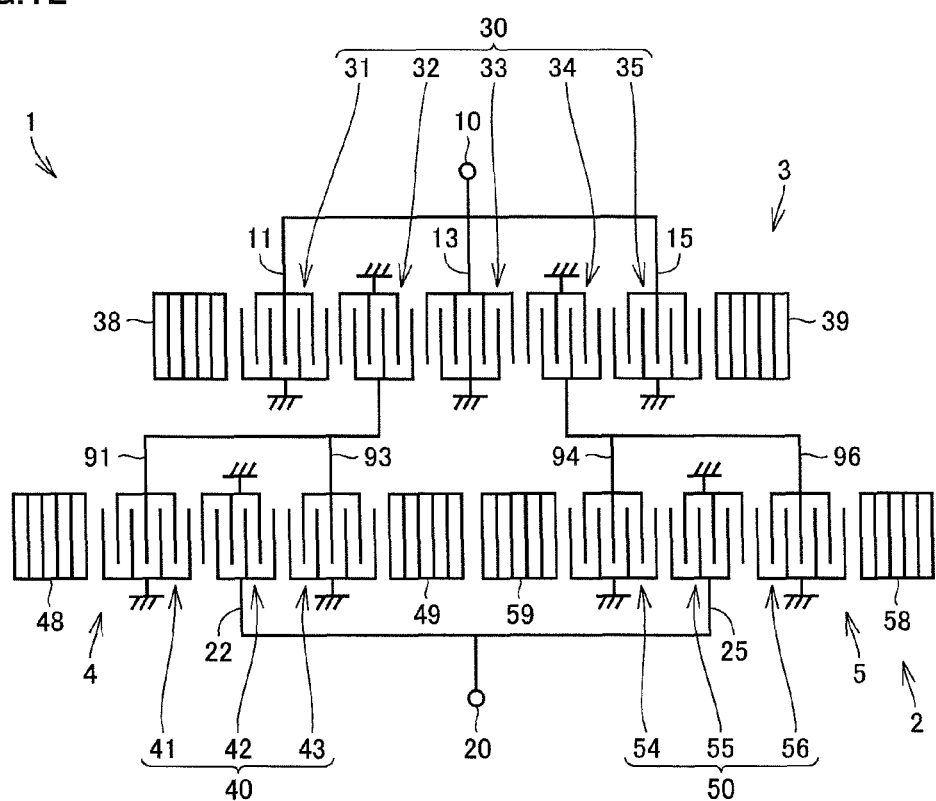
FIG. 12 is a schematic plan view illustrating the basic configuration of a surface acoustic wave filter device of a seventh preferred embodiment of the present invention.

FIG. 12 is a schematic plan view illustrating the basic configuration of a surface acoustic wave filter device 1 of a seventh preferred embodiment of the present invention. The surface acoustic wave filter device 1 of the seventh preferred embodiment has substantially the same configuration as the surface acoustic wave filter device 1 of the sixth preferred embodiment described above and only the configuration of the output terminal 20 is different.

Specifically, in the surface acoustic wave filter device 1 of the seventh preferred embodiment, a common connection is provided between one end of the IDT 42 and one end of the IDT 55 using the signal lines 22 and 25 and this common connection is then connected to a single output terminal 20. The output terminal 20 is an unbalanced signal output terminal through which an unbalanced signal is output from the SAW filter 2.

In the thus-configured surface acoustic wave filter device 1 of the seventh preferred embodiment as well, the SAW filter 3 of the first stage and the SAW filter 2 of the second stage are cascade connected with each other in two stages, the SAW filter 3 of the first stage being a 5-IDT longitudinally coupled resonator-type surface acoustic wave filter and the SAW filter 2 of the second stage including the first filter section 4 and the second filter section 5, which are 3-IDT longitudinally coupled resonator-type surface acoustic wave filters, connected in parallel with each other. Thus, a ripple inside the passband is reduced and spurious in the vicinity of the passband is reduced.

The duplexer 200 described with reference to FIG. 1 may include the surface acoustic wave filter device 1 of any of the second to seventh preferred embodiments of the present invention instead of the surface acoustic wave filter device 1 of the first preferred embodiment illustrated in FIG. 2. In addition, not limited to the duplexer 200, the surface acoustic wave filter device 1 of each preferred embodiment may be applied to any other type of splitter such as a triplexer, a multiplexer or a diplexer, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A surface acoustic wave filter device comprising:
a piezoelectric substrate;
a first surface acoustic wave filter provided on the piezoelectric substrate; and
a second surface acoustic wave filter provided on the piezoelectric substrate; wherein
the first surface acoustic wave filter includes a longitudinally coupled resonator-type first filter section and a longitudinally coupled resonator-type second filter section, the second filter section being electrically connected in parallel or series with the first filter section on at least one of an input signal side and an output signal side;
the first filter section includes a first interdigital transducer (IDT) group including three IDTs arranged in a line in a surface acoustic wave propagation direction and a pair of first reflectors arranged on either side of the first IDT group in the surface acoustic wave propagation direction;
the second filter section includes a second IDT group including three IDTs arranged in a line in the surface acoustic wave propagation direction and a pair of second reflectors arranged on either side of the second IDT group in the surface acoustic wave propagation direction;
the second surface acoustic wave filter includes a third IDT group that is cascade connected to the first filter section and the second filter section and includes a first IDT, a second IDT, a third IDT, a fourth IDT, and a fifth IDT arranged in order in a line in the surface acoustic wave propagation direction, and a pair of third reflectors arranged on either side of the third IDT group in the surface acoustic wave propagation direction;
the second IDT and the fourth IDT of the third IDT group are connected together to one of an input terminal and an output terminal;
a first wiring line connects the first IDT of the third IDT group to a first IDT of the first IDT group;
a second wiring line connects the third IDT of the third IDT group to a third IDT of the first IDT group;
the first wiring line and the second wiring line are opposite to each other in phase;
a third wiring line connects the third IDT of the third IDT group to a first IDT of the second IDT group;
a fourth wiring line connects the fifth IDT of the third IDT group to a third IDT of the second IDT group;
the third wiring line and the fourth wiring line are opposite to each other in phase;
a second IDT of the first IDT group and a second IDT of the second IDT group are connected together to one of the output terminal and the input terminal; and
an integrated common reflector defines one of the pair of first reflectors and one of the pair of second reflectors.

2. The surface acoustic wave filter device according to claim 1, wherein the third IDT of the third IDT group includes a first divided IDT portion and a second divided IDT portion obtained by dividing the third IDT of the third IDT group into two portions in the surface acoustic wave propagation direction, the first divided IDT portion and the first filter section are cascade connected to each other and the second divided IDT portion and the second filter section are cascade connected to each other.

3. The surface acoustic wave filter device according to claim 2, wherein
the third IDT of the third IDT group includes a comb-tooth electrode that opposes the first divided IDT portion and the second divided IDT portion; and
the comb-tooth electrode includes an even number of electrode fingers arranged between the first divided IDT portion and the second divided IDT portion.

4. The surface acoustic wave filter device according to claim 1, wherein a number of electrode fingers of the integrated common reflector is an odd number.

5. The surface acoustic wave filter device according to claim 1, further comprising output terminals, wherein the first IDT group and the second IDT group are electrically connected in series with each other via a ground potential between the output terminals.

6. A duplexer comprising:
the surface acoustic wave filter device according to claim 1.

7. The duplexer according to claim 6, further comprising an antenna terminal connected to an antenna and a surface acoustic wave resonator connected to the surface acoustic wave filter device.

8. The duplexer according to claim 6, wherein the surface acoustic wave filter device defines a reception-side band pass filter.

9. The duplexer according to claim 6, further comprising another surface acoustic wave filter device that defines a transmission-side band pass filter.

10. The duplexer according to claim 9, wherein the another surface acoustic wave filter device has a ladder circuit configuration and includes a plurality of series arm resonators and a plurality of parallel arm resonators.

11. The duplexer according to claim 6, wherein the third IDT of the third IDT group includes a first divided IDT portion and a second divided IDT portion obtained by dividing the third IDT of the third IDT group into two portions in the surface acoustic wave propagation direction, the first divided IDT portion and the first filter section are cascade connected to each other and the second divided IDT portion and the second filter section are cascade connected to each other.

12. The duplexer according to claim 11, wherein
the third IDT of the third IDT group includes a comb-tooth electrode that opposes the first divided IDT portion and the second divided IDT portion; and
the comb-tooth electrode includes an even number of electrode fingers arranged between the first divided IDT portion and the second divided IDT portion.

13. The duplexer according to claim 6, wherein a number of electrode fingers of the integrated common reflector is an odd number.

14. The duplexer according to claim 6, wherein the surface acoustic wave filter device further comprises output terminals, and the first IDT group and the second IDT group are electrically connected in series with each other via a ground potential between the output terminals.

* * * * *